United States Patent
Kou

(10) Patent No.: US 9,362,529 B2
(45) Date of Patent: Jun. 7, 2016

(54) OLED DEVICE AND CORRESPONDING DISPLAY APPARATUS

(75) Inventor: Hao Kou, Shenzhen (CN)

(73) Assignee: SHENZHEN CHINA OPTOELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 13/700,139

(22) PCT Filed: Jul. 25, 2012

(86) PCT No.: PCT/CN2012/079158
§ 371 (c)(1),
(2), (4) Date: Nov. 27, 2012

(87) PCT Pub. No.: WO2014/008682
PCT Pub. Date: Jan. 16, 2014

(65) Prior Publication Data
US 2015/0115224 A1    Apr. 30, 2015

(30) Foreign Application Priority Data
Jul. 11, 2012 (CN) .......................... 2012 1 0239098

(51) Int. Cl.
*H01L 29/08* (2006.01)
*H01L 51/52* (2006.01)
*H01L 27/32* (2006.01)
*H01L 51/50* (2006.01)

(52) U.S. Cl.
CPC ........ *H01L 51/5271* (2013.01); *H01L 27/3211* (2013.01); *H01L 51/5036* (2013.01); *H01L 51/5218* (2013.01); *H01L 51/5234* (2013.01); *H01L 51/5253* (2013.01)

(58) Field of Classification Search
CPC ............ H01L 27/3276; H01L 27/3262; H01L 51/5203; H01L 2251/5361; H01L 2251/5315; H01L 51/5016; H01L 51/5064; H01L 51/5315; H01L 51/5271; H01L 27/3211; H01L 51/5234; H01L 51/5253; H01L 51/5036; H01L 51/5218; H01L 33/22
USPC ...................... 257/40, 88, E25.001, E51.018, 257/E51.024, E51.026, E51.027
See application file for complete search history.

(56) References Cited

U.S. PATENT DOCUMENTS 5,767,029 A * 6/1998 Schuler ................. 501/108
2005/0153162 A1* 7/2005 Takagi et al. ............. 428/673

(Continued)

OTHER PUBLICATIONS

"Correlation between reflectivity and resistivity in multi-component metallicsystems" T. T. Hu, J. H. Hsu, J. C. Huang, S. Y. Kuan, C. J. Lee et al, Jul. 2, 2012; 101; Applied Physics Letters 101,Appl. Phys. Lett. 101 , pp. 011902-1 to 011902-4.*

(Continued)

*Primary Examiner* — Yosef Gebreyesus
(74) *Attorney, Agent, or Firm* — Mark M. Friedman

(57) ABSTRACT

The present invention relates to an OLED device and a corresponding display apparatus, which includes a metal cathode; an organic emitter layer which is disposed on the metal cathode; a transparent cathode which is disposed on the organic emitter layer; and a reflective layer which is disposed between the metal cathode and the organic emitter layer. The reflective layer is an Ag—Mg—Cu alloy layer. The OLED device and the corresponding display apparatus of the present invention have low production cost and high light outputted efficiency.

7 Claims, 5 Drawing Sheets

(56) References Cited

U.S. PATENT DOCUMENTS

| | | | |
|---|---|---|---|
| 2006/0145159 A1* | 7/2006 | Yokoyama et al. | 257/72 |
| 2006/0145967 A1* | 7/2006 | Huh | G09G 3/325 345/76 |
| 2006/0158403 A1* | 7/2006 | Kuma | H01L 51/5036 345/83 |
| 2006/0232196 A1* | 10/2006 | Hachiya | C09K 11/06 313/504 |
| 2006/0255719 A1* | 11/2006 | Oikawa | H01L 51/5206 313/503 |
| 2007/0159085 A1* | 7/2007 | Kuma | C09K 11/06 313/506 |
| 2007/0228942 A1* | 10/2007 | Akai et al. | 313/504 |
| 2007/0295440 A1* | 12/2007 | Stucker | B23K 20/10 156/73.1 |
| 2009/0079338 A1* | 3/2009 | Mori | H01L 51/5036 313/504 |
| 2009/0230845 A1* | 9/2009 | Kuma | H01L 51/5265 313/504 |
| 2010/0072884 A1* | 3/2010 | Tchakarov et al. | 313/504 |
| 2013/0069042 A1* | 3/2013 | Matsuura et al. | 257/40 |
| 2015/0179977 A1* | 6/2015 | Inada | H01L 51/5262 257/40 |

OTHER PUBLICATIONS

"Correlation between refelctivity and resistivity in multi-component metallic systmes" T.T. Hu, J. H. Hsu, J. C. Huang, S. Y. Kuan, C, J. Lee et al., Jul. 2, 2012;101; Applied Physics Letters 101, Appl. Phys. Lett. 101, pp. 011902-1 to 011902-4.*

"Correlation between refelctivity and resistivity in multi-component metallic systmes" T.T. Hu, J. H. Hsu, J. C. Huang, S. Y. Kuan, C, J. Lee et al., Jul. 2, 2012;101 Applied Physics Letters 101, Appl. Phys. Lett. 101, pp. 011902-1 to 011902-4.*

* cited by examiner

OLED DEVICE AND CORRESPONDING DISPLAY APPARATUS

FIELD OF THE INVENTION

The present invention relates to an organic electroluminescent field, and especially to an organic light-emitting diode (OLED) device being capable of raising a light outputted efficiency and a corresponding display apparatus.

BACKGROUND OF THE INVENTION

A liquid crystal display (LCD) has a perfect display effect in the case of no ambient light, but the display effect becomes poor when the ambient light (e.g. sunlight) exists. Therefore, as to the drawback of the LCD, an OLED display apparatus has been developed. The OLED display apparatus includes an anode, a cathode, and an organic emitter layer which is disposed between the anode and the cathode. When the OLED display apparatus operates, an anode hole and a cathode electron are combined in the organic emitter layer, thereby forming an exciton of an electron-hole pair. When the exciton goes back to a ground state, the exciton releases energy for light emission.

Thus, the OLED display apparatus is a self-luminous display apparatus. In comparison with the LCD, visibility and brightness of the OLED display apparatus are higher, and the device can achieve the better display effect when the ambient light exists. Meanwhile, a color filter and a backlight module do not need to be additionally disposed in the OLED display apparatus, so the device further has characteristics of compact size, high contrast ratio, high color saturation, wide viewing angle, high response, low power consumption, and so on.

FIG. 1 is a schematic drawing illustrating an OLED device in the prior art. The OLED device includes a substrate 11, metal cathodes 12, transparent cathodes 13, and organic emitter layers 14 which are disposed between the metal cathodes 12 and the transparent cathodes 13. Furthermore, there are spacers 18 disposed between the different organic emitter layers 14. The metal cathode 12 herein is an opaque Ag electrode. Besides serving as the electrode, the metal cathode 12 further can be utilized to reflect part of the light emitted from the organic emitter layer 14, so that part of the light are emitted from the transparent cathode 13. In order to enhance the light reflection of the metal cathode 12, a reflective layer (not shown in the drawing) can be disposed on a surface of the metal cathode 12. Material of the reflective layer is Ag—Pd—Cu alloy, which consists of silver 90 to 95% by weight, palladium 4 to 8% by weight, and copper about 1% by weight. Production cost of the reflective layer is very high, because the silver of precious metals has a high proportion. Moreover, an alloy system of the Ag—Pd—Cu alloy is a solid solution structure, and metal atoms are distributed as the solid solution in the material. Crystal grains of the silver easily grow abnormally due to a temperature factor in fabricating processes, thus resulting in a rougher surface of the reflective layer. Therefore, an efficiency of the light reflection is influenced, and then the corresponding light outputted efficiency is also influenced.

Therefore, there is a significant need to provide an OLED device and a corresponding display apparatus for solving the problems existing in the prior art.

SUMMARY OF THE INVENTION

An objective of the present invention is to provide an OLED device with low production cost and a high light outputted efficiency as well as a corresponding display apparatus, thereby solving the problems of the high production cost and the low light outputted efficiency in the conventional OLED device and the corresponding display apparatus.

To achieve the foregoing objective, the technical solution of this invention is implemented as follows.

The present invention relates to an OLED device, which includes: a metal cathode; an organic emitter layer disposed on the metal cathode; a transparent cathode disposed on the organic emitter layer; and a reflective layer disposed between the metal cathode and the organic emitter layer. The reflective layer is an Ag—Mg—Cu alloy layer; a weight percentage of magnesium ranges between 12% and 19% in the Ag—Mg—Cu alloy layer. A thickness of the Ag—Mg—Cu alloy layer ranges between 80 nanometers and 150 nanometers.

In the OLED device of the present invention, the weight percentage of magnesium ranges between 14% and 17% in the Ag—Mg—Cu alloy layer.

In the OLED device of the present invention, the thickness of the Ag—Mg—Cu alloy layer ranges between 100 nanometers and 140 nanometers.

In the OLED device of the present invention, the OLED device further includes a buffer layer disposed on the transparent cathode and includes a transparent protective layer disposed on the buffer layer.

In the OLED device of the present invention, the organic emitter layer includes a blue organic emitter layer, a green organic emitter layer, and a red organic emitter layer.

The present invention further relates to an OLED device, which includes: a metal cathode; an organic emitter layer disposed on the metal cathode; a transparent cathode disposed on the organic emitter layer; and a reflective layer disposed between the metal cathode and the organic emitter layer, wherein the reflective layer is an Ag—Mg—Cu alloy layer.

In the OLED device of the present invention, a weight percentage of magnesium ranges between 12% and 19% in the Ag—Mg—Cu alloy layer.

In the OLED device of the present invention, the weight percentage of magnesium ranges between 14% and 17% in the Ag—Mg—Cu alloy layer.

In the OLED device of the present invention, a thickness of the Ag—Mg—Cu alloy layer ranges between 80 nanometers and 150 nanometers.

In the OLED device of the present invention, the thickness of the Ag—Mg—Cu alloy layer ranges between 100 nanometers and 140 nanometers.

In the OLED device of the present invention, the OLED device further includes a buffer layer disposed on the transparent cathode and includes a transparent protective layer disposed on the buffer layer.

In the OLED device of the present invention, the organic emitter layer includes a blue organic emitter layer, a green organic emitter layer, and a red organic emitter layer.

The present invention further relates to a display apparatus, which includes a plurality of OLED devices and a drive circuit. Each OLED device includes: a metal cathode; an organic emitter layer disposed on the metal cathode; a transparent cathode disposed on the organic emitter layer; and a reflective layer disposed between the metal cathode and the organic emitter layer, wherein the reflective layer is an Ag—Mg—Cu alloy layer. The drive circuit is utilized to control the plurality of OLED devices for luminescence.

In the display apparatus of the present invention, a weight percentage of magnesium ranges between 12% and 19% in the Ag—Mg—Cu alloy layer.

In the display apparatus of the present invention, the weight percentage of magnesium ranges between 14% and 17% in the Ag—Mg—Cu alloy layer.

In the display apparatus of the present invention, a thickness of the Ag—Mg—Cu alloy layer ranging between 80 nanometers and 150 nanometers.

In the display apparatus of the present invention, the thickness of the Ag—Mg—Cu alloy layer ranges between 100 nanometers and 140 nanometers.

In the display apparatus of the present invention, the OLED device further includes a buffer layer disposed on the transparent cathode and includes a transparent protective layer disposed on the buffer layer.

In the display apparatus of the present invention, the organic emitter layer includes a blue organic emitter layer, a green organic emitter layer, and a red organic emitter layer.

In comparison with the conventional OLED device and the corresponding display apparatus, the OLED device and the corresponding display apparatus of the present invention have low production cost and a light outputted efficiency; therefore, the problems of the high production cost and the low light outputted efficiency in the conventional OLED device and the corresponding display apparatus are solved.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENTS

Figure 1:
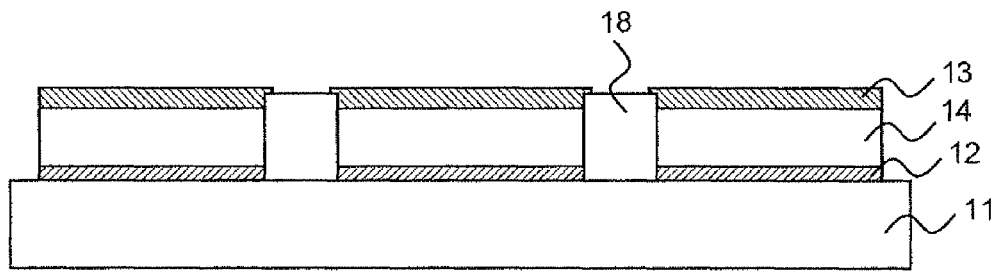
FIG. 1 is a schematic drawing illustrating an OLED device in prior art.

Descriptions of the following embodiments refer to attached drawings which are utilized to exemplify specific embodiments. Directional terms mentioned in the present invention, such as "top" and "down", "front", "rear", "left", "right", "inside", "outside", "side" and so on are only directions with respect to the attached drawings. Therefore, the used directional terms are utilized to explain and understand the present invention but not to limit the present invention.

In different drawings, the same reference numerals refer to like parts throughout the drawings.

Figure 2:
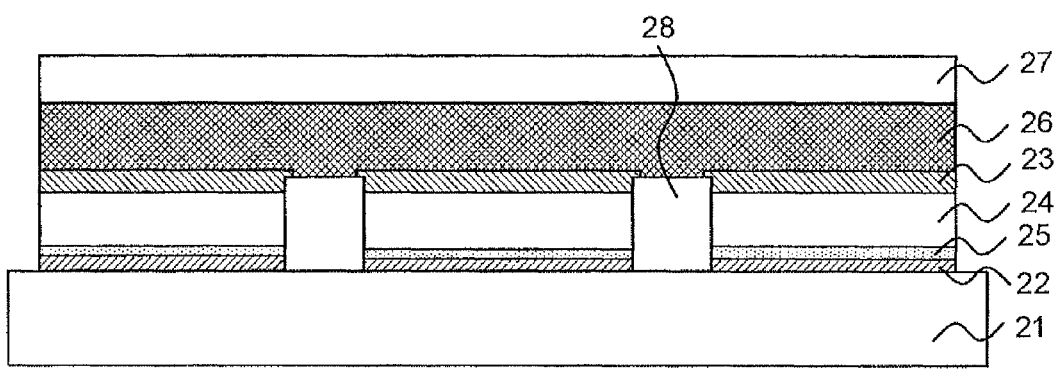
FIG. 2 is a schematic drawing illustrating an OLED device according to a preferred embodiment of the present invention.

Referring to FIG. 2, FIG. 2 is a schematic drawing illustrating an OLED device according to a preferred embodiment of the present invention. The OLED device includes a substrate 21, a metal cathode 22, an organic emitter layer 24, a transparent cathode 23, a reflective layer 25, a buffer layer 26, and a transparent protective layer 27. The metal cathode 22 herein is disposed on the substrate 21; the organic emitter layer 24 is disposed on the metal cathode 22; the transparent cathode 23 is disposed on the organic emitter layer 24. The buffer layer 26 is disposed on the transparent cathode 23 for flattening a surface of the OLED device. The transparent protective layer 27 is disposed on the buffer layer 26 for reducing the influence from outside environment on the OLED device. The organic emitter layer may include a blue organic emitter layer, a green organic emitter layer, and a red organic emitter layer; the different organic emitter layers are isolated by spacers 28. The reflective layer 25 is disposed 24 between the metal cathode 22 and the organic emitter layer 24, and utilized to reflect the light emitted from the organic emitter layer 24, so that the reflected light is emitted from the transparent cathode 23, thereby raising the light outputted efficiency of the OLED device. The reflective layer 25 is an Ag—Mg—Cu alloy layer, in which a weight percentage of copper is about 1%; a weight percentage of magnesium ranges between 12% and 19%, preferably 14% and 17%. A thickness of the Ag—Mg—Cu alloy layer ranges between 80 nanometers and 150 nanometers.

The Ag—Mg—Cu alloy layer is utilized to serve as the reflective layer 25 in the OLED device of the present invention. The crystal structure of magnesium atoms in the Ag—Mg—Cu alloy layer is a close-packed hexagonal structure, and the magnesium atom is capable of forming a stable intermetallic compound with the silver atom in the Ag—Mg—Cu alloy layer, so that the preparation of the Ag—Mg—Cu alloy layer is more stable. Meanwhile, during preparing and using the Ag—Mg—Cu alloy layer, the formed, stable Ag—Mg intermetallic compound can effectively pin and hinder a growth of the Ag crystal grains, stemming from surface energy of the silver, in the Ag—Mg—Cu alloy layer. Accordingly, the surface of the Ag—Mg—Cu alloy layer is smoother during preparing and using the Ag—Mg—Cu alloy layer. Meanwhile, the magnesium is similar to the silver; both are white and silver. As a result, the efficiency of the light reflection can be greatly increased, so as to raise the light outputted efficiency of the display apparatus.

When the Ag—Mg—Cu alloy layer of the present invention is utilized to serve as the reflective layer 25, the weight percentage of the magnesium in the Ag—Mg—Cu alloy layer should not be too high or too low. If the weight percentage of the magnesium is too high, it may cause that the stable Ag—Mg intermetallic compound can not be formed from the magnesium atom and the silver atom, but a mixture of AgMg and $AgMg_3$ is formed. Thus, complex and diversified structures will reduce the stability to a considerable degree during preparing and using the material. If the weight percentage of the magnesium is too low, the weight percentage of the silver needs to be greatly increased (the doped cooper is a trace element with about 1% by weight), thereby making the production cost of the reflective layer 25 greatly raised. The experiment results show that it can achieve a better result while the weight percentage of the magnesium ranges between 12% and 19% in the Ag—Mg—Cu alloy layer. It can achieve the best result while the weight percentage of the magnesium ranges between 14% and 17% in the Ag—Mg—Cu alloy layer. The specific description is as follows.

Figure 3:
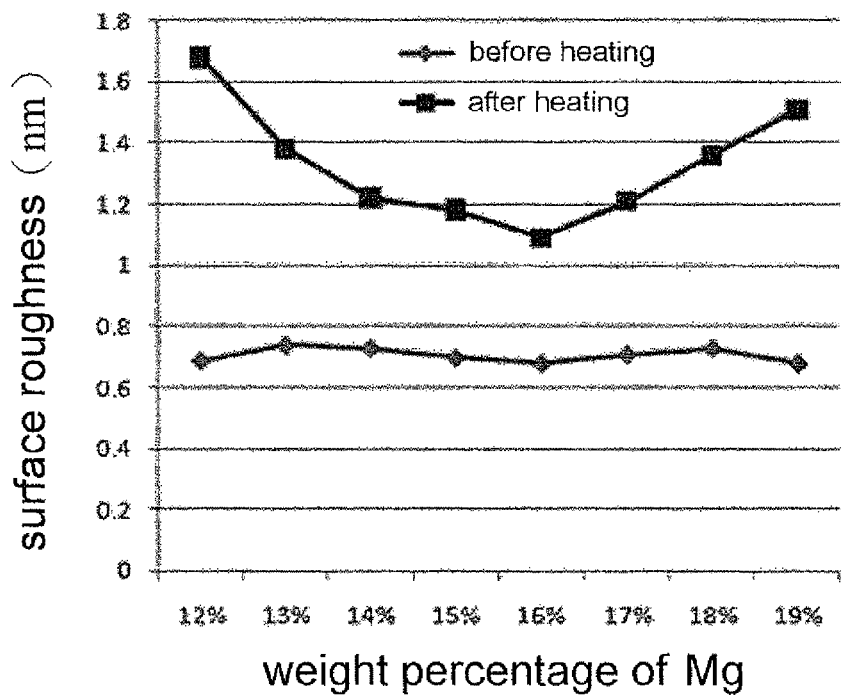
FIG. 3 is a schematic drawing illustrating surface roughness relating to various contents of the magnesium in the Ag—Mg—Cu alloy layer.

Referring to FIG. 3, FIG. 3 is a schematic drawing illustrating surface roughness relating to various contents of the magnesium in the Ag—Mg—Cu alloy layer. Eight samples of the Ag—Mg—Cu alloy layers with the weight percentages 12%-19% of the magnesium in the Ag—Mg—Cu alloy layer are tested. Then the eight samples of the Ag—Mg—Cu alloy layers are thermally processed, that is, said samples are placed in a nitrogen protection oven to heat to 250□ for one hour and then the surface roughness test is performed again after them are taken out of the oven. It can be seen from the drawing that the surface roughnesses of the weight percentages 14%-17% of the magnesium in the Ag—Mg—Cu alloy layer are lower; thus, the reflection performance is better.

A thickness of the Ag—Mg—Cu alloy layer of the present invention ranges best between 80 nanometers and 150 nanometers. If the thickness of the Ag—Mg—Cu alloy layer is too large, the surface roughness of the reflective layer 25 is too high, on the contrary, such that the reflection efficiency of the reflective layer 25 is decreased. If the thickness of the Ag—Mg—Cu alloy layer is too small, the light transmittance of the reflective layer 25 is raised, resulting in low reflection efficiency of the reflective layer 25. The experiment results show that it can achieve a better result while the thickness of the Ag—Mg—Cu alloy layer ranges between 80 nanometers and 150 nanometers. It can achieve the best result while the thickness of the Ag—Mg—Cu alloy layer ranges between 100 nanometers and 140 nanometers. The specific description is as follows.

Figure 4:
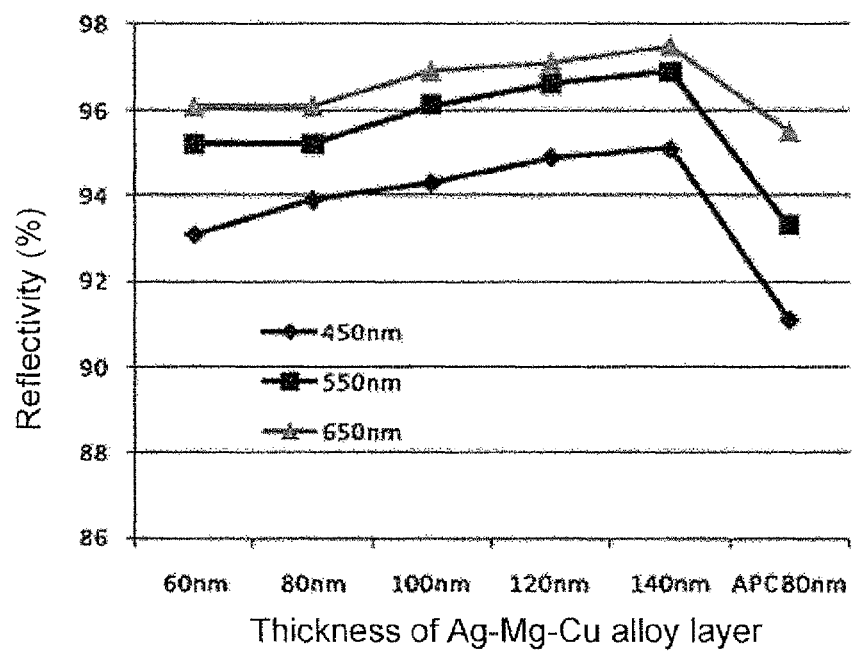
FIG. 4 is a spectrum illustrating reflectivities relating to various thicknesses of the Ag—Mg—Cu alloy layer.

Referring to FIG. 4, FIG. 4 is a spectrum illustrating reflectivities relating to various thicknesses of the Ag—Mg—Cu alloy layer. It can be seen from the drawing that the Ag—Mg—Cu alloy layer with the thickness ranging between 100 nanometers and 140 nanometers has higher reflectivities either for the light with longer wavelength or for the light with shorter wavelength and has better reflection performances.

Figure 5:
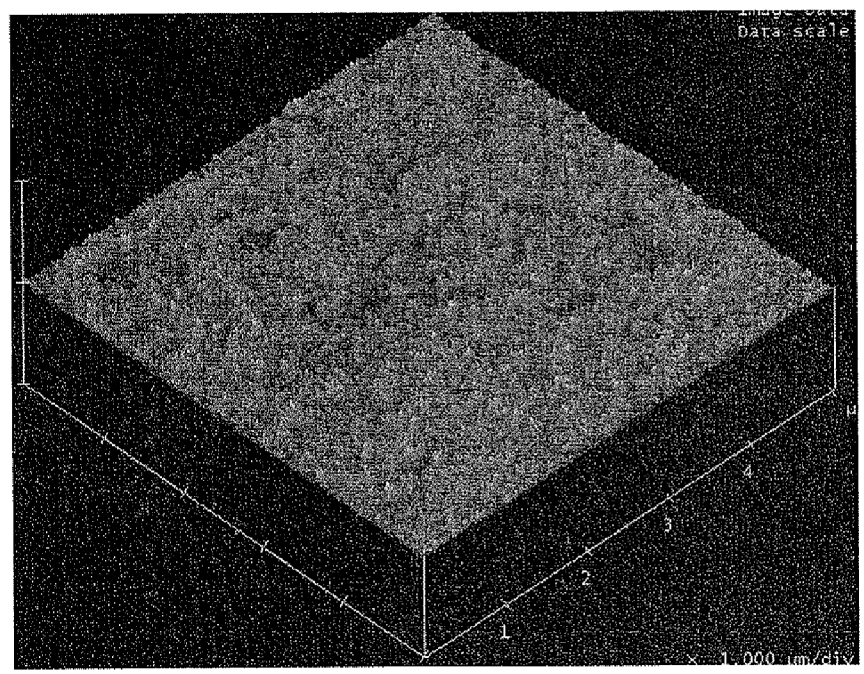
FIG. 5 is a morphological drawing illustrating the surface roughness of the Ag—Mg—Cu alloy layer before the heat treatment.
Figure 6:
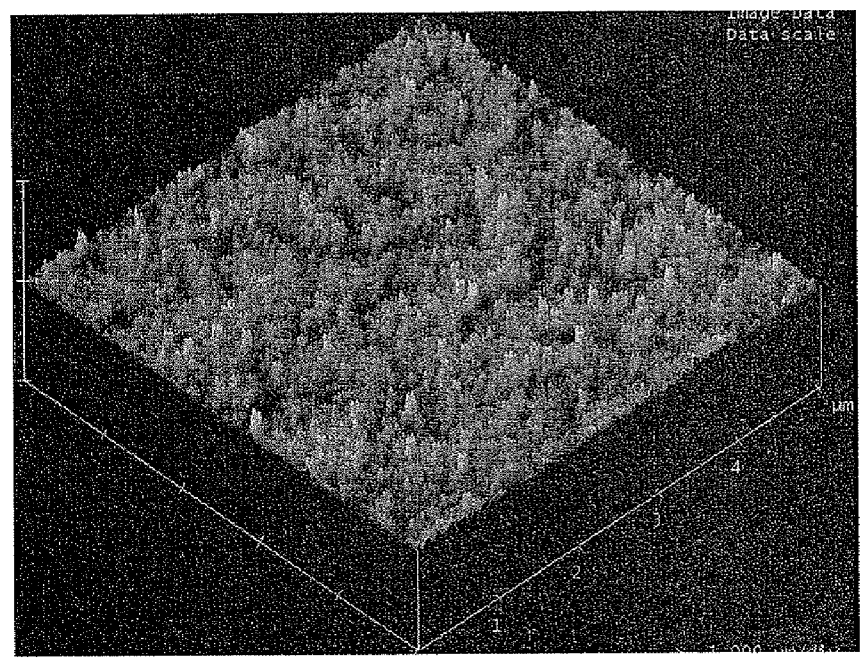
FIG. 6 is a morphological drawing illustrating the surface roughness of the Ag—Mg—Cu alloy layer after the heat treatment.
Figure 7:
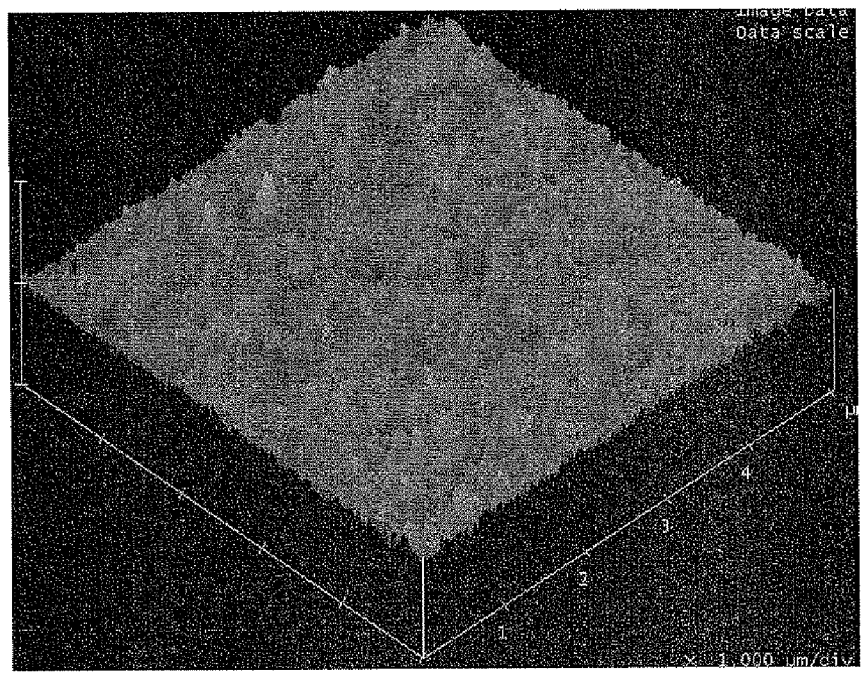
FIG. 7 is a morphological drawing illustrating the surface roughness of the Ag—Pd—Cu alloy layer before the heat treatment.
Figure 8:
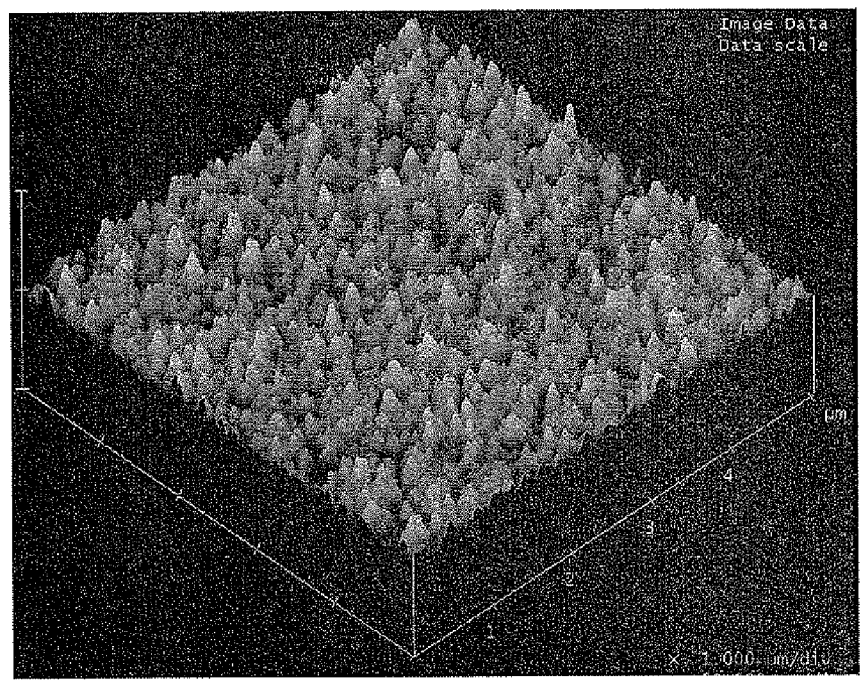
FIG. 8 is a morphological drawing illustrating the surface roughness of the Ag—Pd—Cu alloy layer after the heat treatment.

That the reflection performance of the Ag—Mg—Cu alloy reflective layer of the present invention is much better than the Ag—Pd—Cu alloy reflective layer in the prior art will now be described with reference to FIG. 5 to FIG. 8 and corresponding experiment data. FIG. 5 is a morphological drawing illustrating the surface roughness of the Ag—Mg—Cu alloy layer before a heat treatment; FIG. 6 is a morphological drawing illustrating the surface roughness of the Ag—Mg—Cu alloy layer after the heat treatment; FIG. 7 is a morphological drawing illustrating the surface roughness of the Ag—Pd—Cu alloy layer before the heat treatment; FIG. 8 is a morphological drawing illustrating the surface roughness of the Ag—Pd—Cu alloy layer after the heat treatment.

The Ag—Mg—Cu alloy layer and the Ag—Pd—Cu alloy layer herein are made by sputtering, and the thicknesses of both are 120 nanometers. Before a heat treatment a surface roughness test for the Ag—Mg—Cu alloy layer and the Ag—Pd—Cu alloy layer is performed by using an atomic force microscopy. The surface roughness (Ra) of the Ag—Mg—Cu alloy layer in FIG. 5 is 0.72 nanometer; the surface roughness of the Ag—Pd—Cu alloy layer in FIG. 7 is 0.84 nanometer. It can be seen from the foregoing that the surface flatness of the Ag—Mg—Cu alloy layer is better than that of the Ag—Pd—Cu alloy layer under a condition of the reflective layers with the same thicknesses. Then the Ag—Pd—Cu alloy layer and the Ag—Mg—Cu alloy layers are thermally processed. That is, them are placed in the nitrogen protection oven to heat to 250□ for one hour and then the surface roughness test is performed again after them are taken out of the oven. The surface roughness of the Ag—Mg—Cu alloy layer after the heat treatment in FIG. 6 is 1.29 nanometers; the surface roughness of the Ag—Pd—Cu alloy layer after the heat treatment in FIG. 8 is 2.71 nanometers. It can be seen from the foregoing that the surface roughness of the Ag—Pd—Cu alloy layer has increased over 3 times, and the surface roughness of the Ag—Mg—Cu alloy layer has only increased less than 2 times. Thus, reliability or endurance of the Ag—Mg—Cu alloy layer is also better than that of the Ag—Pd—Cu alloy layer.

Figure 9:
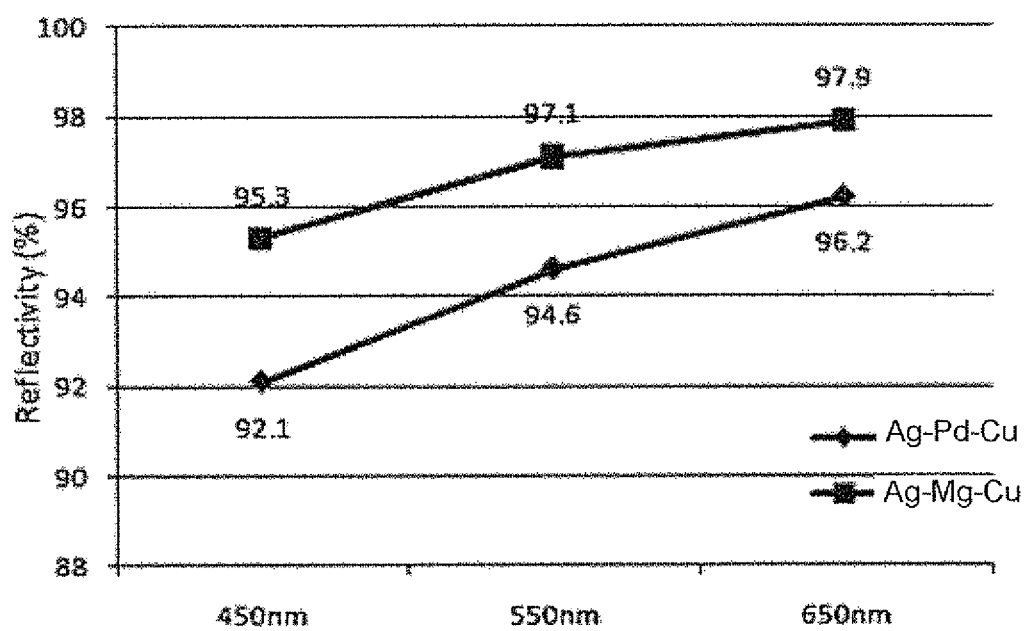
FIG. 9 is a spectrum illustrating reflectivities of the Ag—Mg—Cu alloy layer and the Ag—Pd—Cu alloy layer relating to various wavelengths.

Referring to FIG. 9, FIG. 9 is a spectrum illustrating reflectivities of the Ag—Mg—Cu alloy layer and the Ag—Pd—Cu alloy layer relating to various wavelengths. Similarly, the Ag—Mg—Cu alloy layer and the Ag—Pd—Cu alloy layer herein are made by sputtering, and the thicknesses of both are 120 nanometers. As shown in the drawing, as to blue light of wavelength 450 nm, the reflectivity of the Ag—Mg—Cu alloy layer is 95.3%, and the reflectivity of the Ag—Pd—Cu alloy layer is 92.1%; as to yellowish-green light of wavelength 550 nm, the reflectivity of the Ag—Mg—Cu alloy layer is 97.1%, and the reflectivity of the Ag—Pd—Cu alloy layer is 94.6%; as to red light of wavelength 650 nm, the reflectivity of the Ag—Mg—Cu alloy layer is 97.9%, and the reflectivity of the Ag—Pd—Cu alloy layer is 96.2%. In the wavelengths ranging from 450 nanometers to 650 nanometers, the reflectivities of the Ag—Mg—Cu alloy layer are all better than that of the Ag—Pd—Cu alloy layer.

The present invention further relates to a display apparatus. The display apparatus includes a plurality of OLED devices. The OLED device includes a substrate; a metal cathode which is disposed on the substrate; an organic emitter layer which is disposed on the metal cathode; a transparent cathode which is disposed on the organic emitter layer; and a reflective layer which is disposed between the metal cathode and the organic emitter layer. The reflective layer is an Ag—Mg—Cu alloy layer, and the drive circuit is utilized to control the plurality of OLED devices for luminescence. A weight percentage of magnesium preferably ranges between 12% and 19% in the Ag—Mg—Cu alloy layer; the weight percentage of magnesium best ranges between 14% and 17% in the Ag—Mg—Cu alloy layer. Preferably, a thickness of the Ag—Mg—Cu alloy layer ranges between 80 nanometers and 150 nanometers.

Specific implementing method and advantageous effects of the display apparatus of the present invention are the same or similar to the above-mentioned embodiment of the OLED device, and detail describes can refer to the above-mentioned embodiment of the OLED device.

In summary, the OLED device and the corresponding display apparatus of the present invention employ magnesium metal to replace palladium metal for fabricating the alloy of reflective layer; therefore, the production cost can be significantly reduced. Meanwhile, the reliability, the endurance, and the reflection efficiency of the reflective layer can be improved by using the Ag—Mg—Cu alloy layer to serve as reflective layer, so as to increase the light outputted efficiency of the display apparatus. The problems of the high production cost and the low light outputted efficiency in the conventional OLED device and the corresponding display apparatus are solved.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A display apparatus, comprising:
a plurality of OLED devices, each of which comprises:
a metal cathode;
an organic emitter layer disposed on the metal cathode;
a transparent cathode disposed on the organic emitter layer; and
a reflective layer disposed between the metal cathode and the organic emitter layer, the reflective layer being an Ag—Mg—Cu alloy layer;
a drive circuit utilized to control the plurality of OLED devices for luminescence; and
wherein the Ag—Mg—Cu alloy layer is made by sputtering, then the Ag—Mg—Cu alloy layer is thermally processed, a surface roughness of the Ag—Mg—Cu alloy layer after a heat treatment is 1.29 nanometers.

2. The display apparatus according to claim 1, wherein a weight percentage of magnesium ranges between 12% and 19% in the Ag—Mg—Cu alloy layer.

3. The display apparatus according to claim 2, wherein the weight percentage of magnesium ranges between 14% and 17% in the Ag—Mg—Cu alloy layer.

4. The display apparatus according to claim 1, wherein a thickness of the Ag—Mg—Cu alloy layer ranging between 80 nanometers and 150 nanometers.

5. The display apparatus according to claim 4, wherein the thickness of the Ag—Mg—Cu alloy layer ranges between 100 nanometers and 140 nanometers.

6. The display apparatus according to claim 1, wherein the OLED device further comprises a buffer layer disposed on the transparent cathode and comprises a transparent protective layer disposed on the buffer layer.

7. The display apparatus according to claim 1, wherein the organic emitter layer comprises a blue organic emitter layer, a green organic emitter layer, and a red organic emitter layer.

* * * * *